US006972050B2

(12) United States Patent
Bremser et al.

(10) Patent No.: US 6,972,050 B2
(45) Date of Patent: Dec. 6, 2005

(54) METHOD FOR DEPOSITING IN PARTICULAR CRYSTALLINE LAYERS, AND DEVICE FOR CARRYING OUT THE METHOD

(75) Inventors: Michael Bremser, Pasadena, CA (US); Martin Dauelsberg, Aachen (DE); Gerhard Karl Strauch, Aachen (DE)

(73) Assignee: Aixtron AG, (DE)

( * ) Notice: Subject to any disclaimer, the term of this patent is extended or adjusted under 35 U.S.C. 154(b) by 153 days.

(21) Appl. No.: 10/439,195

(22) Filed: May 15, 2003

(65) Prior Publication Data
US 2004/0013801 A1   Jan. 22, 2004

Related U.S. Application Data

(63) Continuation of application No. PCT/EP01/12467, filed on Oct. 27, 2001.

(30) Foreign Application Priority Data
Nov. 17, 2000   (DE) ................................ 100 57 134

(51) Int. Cl.$^7$ ............................................. C30B 25/08
(52) U.S. Cl. ........................... 117/93; 117/99; 117/102; 118/716; 118/718
(58) Field of Search ................................ 118/715, 716; 117/93, 99, 102

(56) References Cited

U.S. PATENT DOCUMENTS 4,844,006 A * 7/1989 Page et al. .................. 118/719

(Continued)

FOREIGN PATENT DOCUMENTS

DE              198 55 637 A1    6/2000

OTHER PUBLICATIONS

R. Beccard, H. Protzmann, D. Schmitz, G. Strauch, M. Heuken and H. Juergenseon, *A Novel Reactor Concept For Multiwafer Growth of III-V Semiconductors*, Journal of Crystal Growth, 1999, pp. 1049-1555.

*Primary Examiner*—Robert Kunemund
(74) *Attorney, Agent, or Firm*—St. Onge Steward Johnston & Reens LLC

(57) ABSTRACT

The invention relates to a method for depositing especially, crystalline layers onto especially, crystalline substrates, in a process chamber of a CVD reactor. At least one first and one second reaction gas are each led into a gas outlet area in an input area of the process chamber, by means of separate delivery lines. The gas outlet areas lie one above the other between the floor of the process chamber and the cover of the process chamber and have different heights. The first reaction gas flows out of the gas outlet area that is situated next to the process chamber floor, optionally together with a carrier gas. A carrier gas is added at least to the second reaction gas, which flows out of the gas outlet area lying further away from the process chamber floor. The flow parameters are selected in such a way that the second reaction gas is essentially only pyrolytically decomposed in the inlet area and the products of decomposition diffuse crosswise to the direction of Dow of the gases to a substrate located on the process chamber floor, in a deposition area which is located downstream of the input area. Upon reaching said substrate, said products of decomposition condense to form a layer, together with products of decomposition of the first reaction layer. The invention aims to ensure that the decomposition of the organometallic products of decomposition takes place essentially only in the inlet area, even in the case of longer deposition areas, and to ensure that the partial pressures of the products of decomposition (depletion) in the gas phase above the deposition area maintain an essentially linear course. To this end, the invention provides that the kinematic viscosity of the carrier gas that is added to the second reaction gas is adjusted, especially by mixing two gases which differconsiderably in terms of their kinematic viscosity, in such a way that the quotient of Reynolds numbers in the two gas outlet areas is approximately one for essentially approximately identical average gas speeds.

11 Claims, 4 Drawing Sheets

U.S. PATENT DOCUMENTS 4,848,273 A * 7/1989 Mori et al. .................. 118/729
5,383,970 A * 1/1995 Asaba et al. ................ 118/726
5,833,754 A * 11/1998 Ito et al. ..................... 118/725
6,558,736 B2 * 5/2003 Forrest et al. ................ 427/64

* cited by examiner

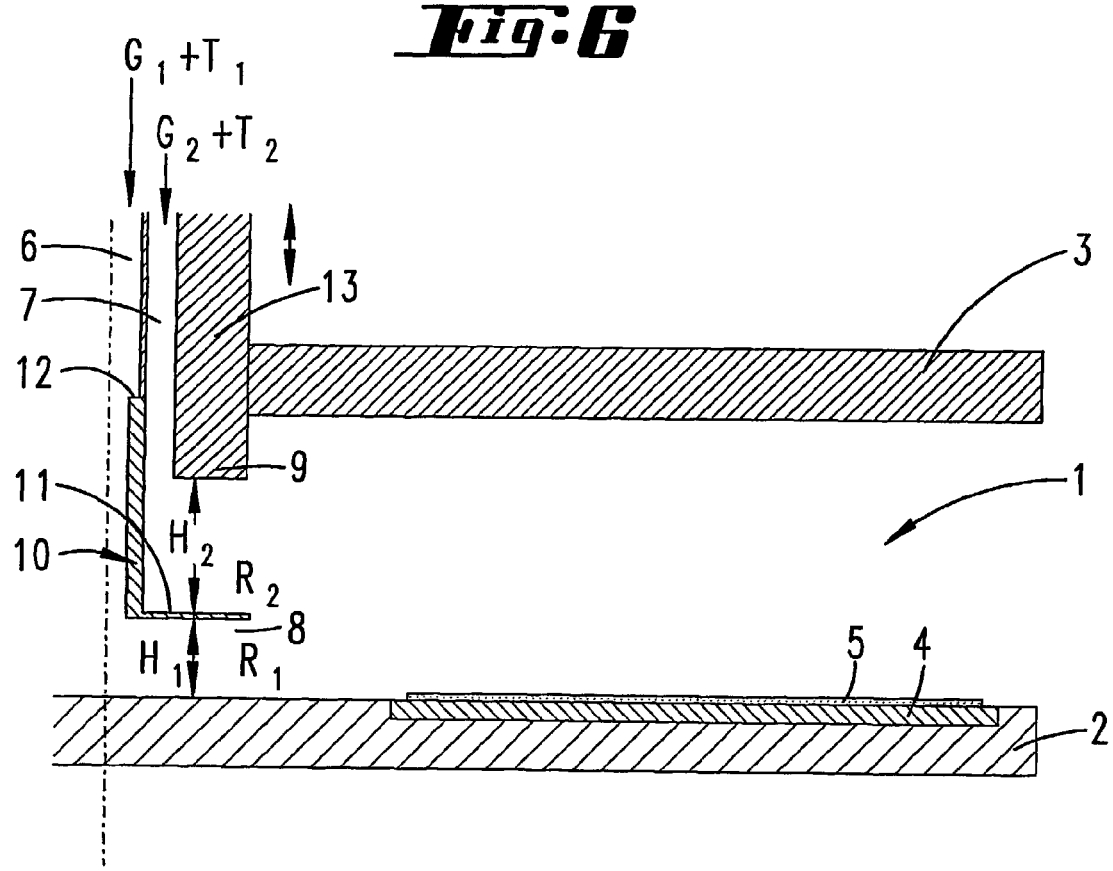

METHOD FOR DEPOSITING IN PARTICULAR CRYSTALLINE LAYERS, AND DEVICE FOR CARRYING OUT THE METHOD

This application is a continuation of pending International Patent Application No. PCT/EP01/12467 filed Oct. 27, 2001, which designates the United States and claims priority of pending German Application No. 100 57 134, filed Nov. 17, 2000.

FIELD OF THE INVENTION

The invention relates to a method for depositing in particular crystalline layers on in particular crystalline substrates in a process chamber of a CVD reactor, in which at least a first reaction gas and a second reaction gas are passed through separate feedlines into in each case a gas outlet zone in an entry zone of the process chamber, in which method the gas outlet zones lie one above the other between the process chamber base and the process chamber cover and have different heights, in which method the first reaction gas, if appropriate together with a carrier gas, flows out of the gas outlet zone adjacent to the process chamber base, and in which method a carrier gas is admixed at least with the second reaction gas which flows out of the gas outlet zone which is remote from the process chamber base and the flow parameters are selected in such a way that the second reaction gas decomposes pyrolytically substantially only in the entry zone, and the decomposition products diffuse, in a deposition zone disposed downstream of the entry zone, transversely with respect to the direction of flow of the gases, to a substrate disposed on the process chamber base where, together with decomposition products of the first reaction gas, they condense to form a layer.

A method of this type is shown, for example, by DE 19 855 637, by means of which binary, ternary and quaternary compound semiconductors, such as for example gallium arsenide, indium phosphide, aluminum gallium arsenide, indium gallium arsenide phosphide or the like can be produced.

In the known method, the method parameters are set in such a way that the metalorganic reaction gases which flow into the process chamber through the second gas outlet zone, which is remote from the process chamber base, decompose almost completely in an inlet zone which directly adjoins the gas outlet zone. The decomposition products are then conveyed onward, by means of the gas stream flowing between process chamber cover and process chamber base, into a deposition zone in which one or more substrates are located. The known device has a cylinder-symmetrical structure in which the gas feedlines are disposed in the center and the gas stream flows radially outward. In this device, the substrates are positioned in the form of satellites on substrate holders which are driven in rotation. To obtain a layer thickness and layer composition which is as homogenous as possible, the process parameters are selected in such a way that the vapor phase depletion of the metalorganic components is substantially linear over the deposition zone. At increasing distance from the center, the partial pressure of the decomposition products of the metalorganic components should decrease linearly, so that as a result of the rotation of the substrate holders overall a homogenous layer is deposited. These boundary conditions require a certain ratio between length of the deposition zone and process chamber height, which is defined by the spacing between process chamber base and process chamber cover. The flow rate must be set in such a way that the metalorganic components decompose substantially only in the entry zone. At the same time, it is necessary to prevent the reaction gases from mixing with one another in the entry zone, in order to avoid the formation of adducts and/or cross-reactions. In technological terms, this problem is solved, in reprocess chambers with a short deposition zone length, through the gas outlet zone for the metal hydrides which is disposed directly above the reactor base having a low height (for example only 1 cm). In the case of small reactors in which, for example, the deposition zone is approximately 10 cm long, it is possible, by selecting the flow parameters, to set conditions in which the metalorganic components decompose almost exclusively in the entry zone, and in the depletion zone the drop in the partial pressure of the decomposition products of the metalorganic compounds is virtually linear over the length.

Furthermore, economic production of semiconductor layers using a method of this type requires the vapor phase depletion to be as high as possible at the end of the deposition zone. Ideally, the partial pressure of the metalorganic decomposition product at that location should be equal to zero. In a process which uses a plurality of metalorganic components, these conditions should apply to each metalorganic component.

Therefore, increasing the length of the deposition zone not only entails the need also to increase the process chamber height, but also the height of the gas outlet zone for the second reaction gas and also, disproportionately, the gas stream flowing out of it. The associated greatly increased flow rate has the effect that the metalorganic components do not decompose completely in the gas inlet zone, and that, as a result of parasitic growth at the cover of the process chamber, the partial pressures of the metalorganic decomposition products does not drop linearly.

The invention is based on the object of ensuring that even with relatively long deposition zones the decomposition of the metalorganic decomposition products takes place substantially only in the entry zone, and the partial pressures of the decomposition products (depletion) in the vapor phase retains a substantially linear profile over the deposition zone.

The object is achieved by the invention described in the claims.

Claim 1 provides firstly and substantially that the kinematic viscosity of the carrier gas which is admixed with the second reaction gas is set, in particular by mixing two gases of very different kinematic viscosity, in such a manner that the quotient of the Reynolds numbers in the two gas outlet zones, given substantially equal mean gas velocities, is approximately one. This procedure ensures that the temperature profile in the process chamber, which is heated from the process chamber base, is only influenced to an insignificant degree by the carrier gas which is admixed with the second reaction gas, and consequently the decomposition of the metalorganic components takes place substantially only in the entry zone. The reduced flow rate which results has the consequence, in the region of the deposition zone, that the decomposition products diffuse out of the vapor phase toward the substrate in such a manner that the depletion at that location has a linear profile and is so high toward the end of the deposition zone that an efficiency of at least 50% can be achieved. The procedure enables the height of the gas outlet zone associated with the second reaction gas to be at least twice as great, in particular at least four times as great, preferably five times as great, as the height of the first gas outlet zone associated with the first reaction gas. Two or more inert gases, for example noble gases or hydrogen or nitrogen, can be mixed with one another in order to set the kinematic viscosity of the carrier gas. It is preferable for the mixture of hydrogen and nitrogen to be admixed with the second reaction gas. However, it is also possible to use exclusively nitrogen as carrier gas for the second reaction gas. As a result, compared to hydrogen, for the same mean gas velocity, the Reynolds number rises by a factor of 7, and consequently the method can be carried out using a volumetric flow which is seven times smaller. It is preferable to use a mixing ratio of 1:1.

The invention also relates to a device for carrying out the method, in which the sum of the lengths of entry zone and deposition zone is greater than 35 cm, the sum of the heights of the gas outlet zones is at least 4 cm, the length of the deposition zone is at least 20 cm and the ratio of the height of the second gas outlet zone to the height of the first gas outlet zone is greater than 4.

At least two carrier gas feedlines open out into the gas feedline for the gas outlet zone which is remote from the base. Each of the two carrier gas feedlines is provided with a gas flow controller, preferably a mass flow controller, so that different carrier gases, in a mixing ratio which can be set as desired, can be fed to the gas outlet zone.

Alternatively, to achieve the object on which the invention is based, there is provision for the heights of the gas outlet zones to be set, in particular by selection of a suitable gas outlet flange, in such a manner that the quotient of the Reynolds numbers in the two gas outlet zones, given substantially approximately the same mean gas velocities, is approximately 1. The heights can be set by means of the said gas outlet flanges. These may be in various forms and in particular different lengths. A suitable gas outlet flange is used as a function of the process parameters which are set in a coating process. However, it is also possible for the gas outlet flange to be configured such that its height can be adjusted, so that it is possible to alter the Reynolds numbers during the process. As an alternative, it is also possible for the upper boundary wall of the gas outlet zone which is removed from the process chamber base to be displaced on a collar of the gas outlet flange, in order in this way to influence the opening width.

BRIEF DESCRIPTION OF DRAWINGS

An exemplary embodiment of the invention is explained below with reference to the appended drawings, in which:

FIG. 6 shows a further exemplary embodiment of the invention in which the heights are adjustable.

DETAILED DESCRIPTION OF DRAWINGS

Figure 1:
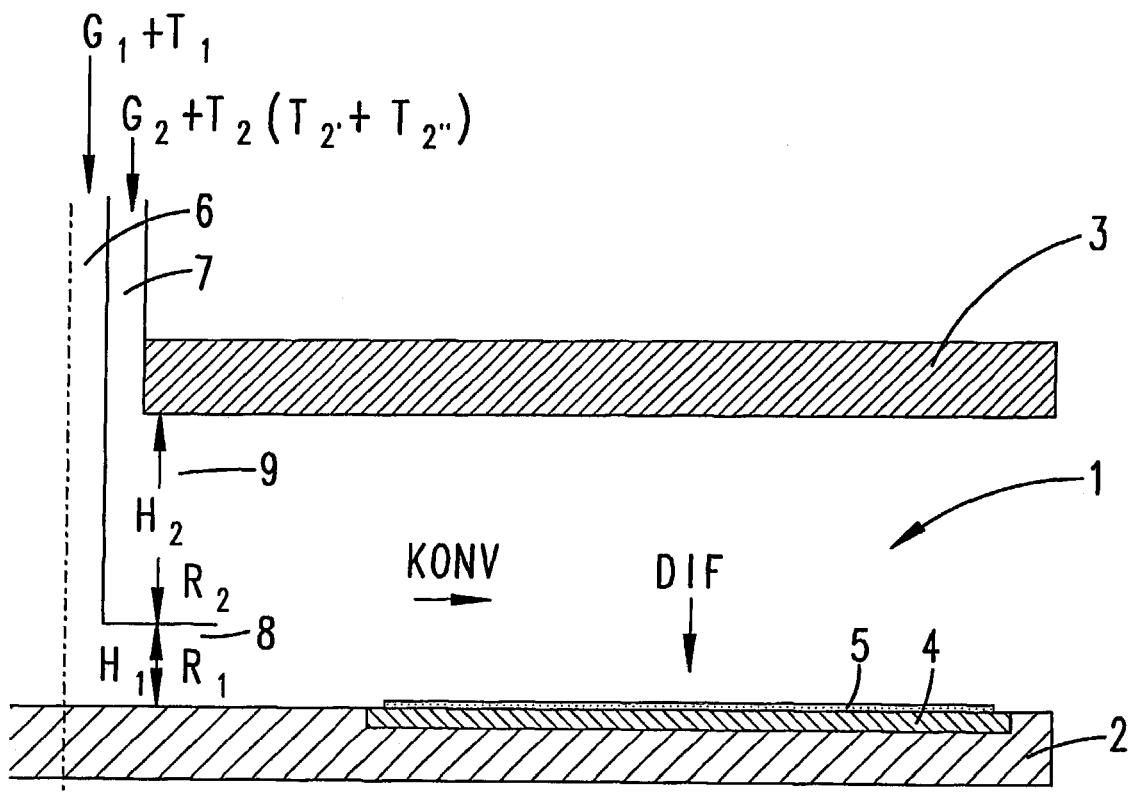
FIG. 1 shows in diagrammatic sectional illustration, half of a process chamber of a cylinder-symmetrical reactor.

The device for carrying out the method comprises a process chamber 1, which has a process chamber base 2 which consists of graphite and which can be heated from below, in particular by means of high frequency. Above the process chamber base 2 there is, at a spacing from the latter, a process chamber cover 3, which likewise consists of graphite but is preferably unheated. The process chamber 1 is cylindrically symmetrical. Process chamber base 2 and process chamber cover 3 are in the form of circular discs.

Two separate feedlines 6, 7 for reaction gases G1, G2 and carrier gases T1 and T2 project into the center of the process chamber 1. The two feedlines 6, 7 open out into gas outlet zones 8, 9 which are disposed one above the other between process chamber base and process chamber cover 3. The height H1 of the first gas outlet zone 8 may be approximately 1 cm. This gas outlet zone 8 is located directly above the process chamber base 2. Above the first gas outlet zone 8, and separate from this, there is a second gas outlet zone 9, the height H2 of which is approximately four to five times the height H1 of the first gas outlet zone 8. A hydride, in particular a metal hydride, such as for example arsine or phosphine, if appropriate together with a carrier gas, which is preferably hydrogen, flows through the first gas outlet zone 8.

Trimethylindium and/or trimethylgallium, together with a carrier gas T2, which differs from the carrier gas T1 at least in terms of its kinematic viscosity, flows through the second gas outlet zone 9. In the exemplary embodiment, the carrier gas T2 is a mixture between a carrier gas T2' and T2", a mixture of hydrogen and nitrogen being provided for in this case.

The flows of the reaction gases and of the carrier gases are controlled. For this purpose, known mass flow controllers (not shown in the drawings) are located in the gas feedlines. At least two carrier gas feedlines open out into the feedline 7. A carrier gas feedline is used to admix nitrogen. The other carrier gas feedline is used to admix hydrogen. Both feedlines have a mass flow controller, so that the mixing ratio of hydrogen to nitrogen can be preset as desired.

The height of the process chamber 1 (H1+H2) is approximately 4.5 cm. The radius of the process chamber 1 corresponds to the sum of the lengths of the entry zone E and of the deposition zone D. The latter is 20 cm, and consequently the radius is between 35 and 40 cm.

A mean gas velocity can be determined from the height H1 or H2 and the gas volumetric flows passing through the two gas outlet zones 8, 9. The process parameters are optimum if the mean gas velocity in the first gas outlet zone approximately corresponds to that of the second gas outlet zone. The mixing ratio of T2' and T2" is selected in such a way that the Reynolds numbers R1 and R2 in the first gas outlet zone and in the second gas outlet zone are approximately equal. If appropriate, this can be achieved by using nitrogen alone as carrier gas T2.

The volumetric flows are selected in such a way that the metalorganic components which flow through the second gas outlet zone 9 together with the second carrier gas T2 decompose substantially completely within the entry zone E; in this context, the admixing of nitrogen as carrier gas has the advantage that the overall diffusion in the vapor phase is reduced, so that the formation of adducts and/or cross-reactions between the hydrides and the metalorganic components are also counteracted.

Figure 2:
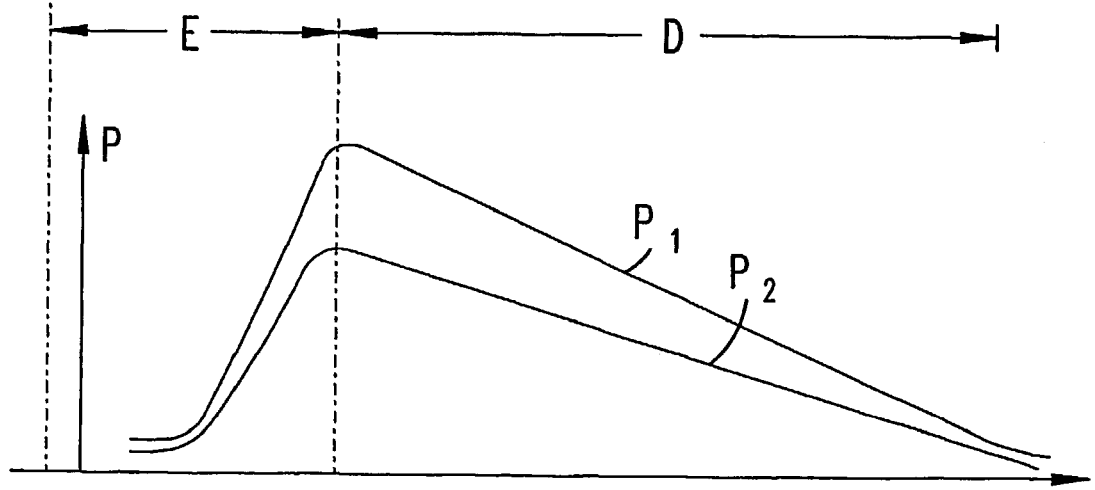
FIG. 2 shows the partial pressure curve of two metalorganic decomposition products over the radius of the process chamber.
Figure 3:
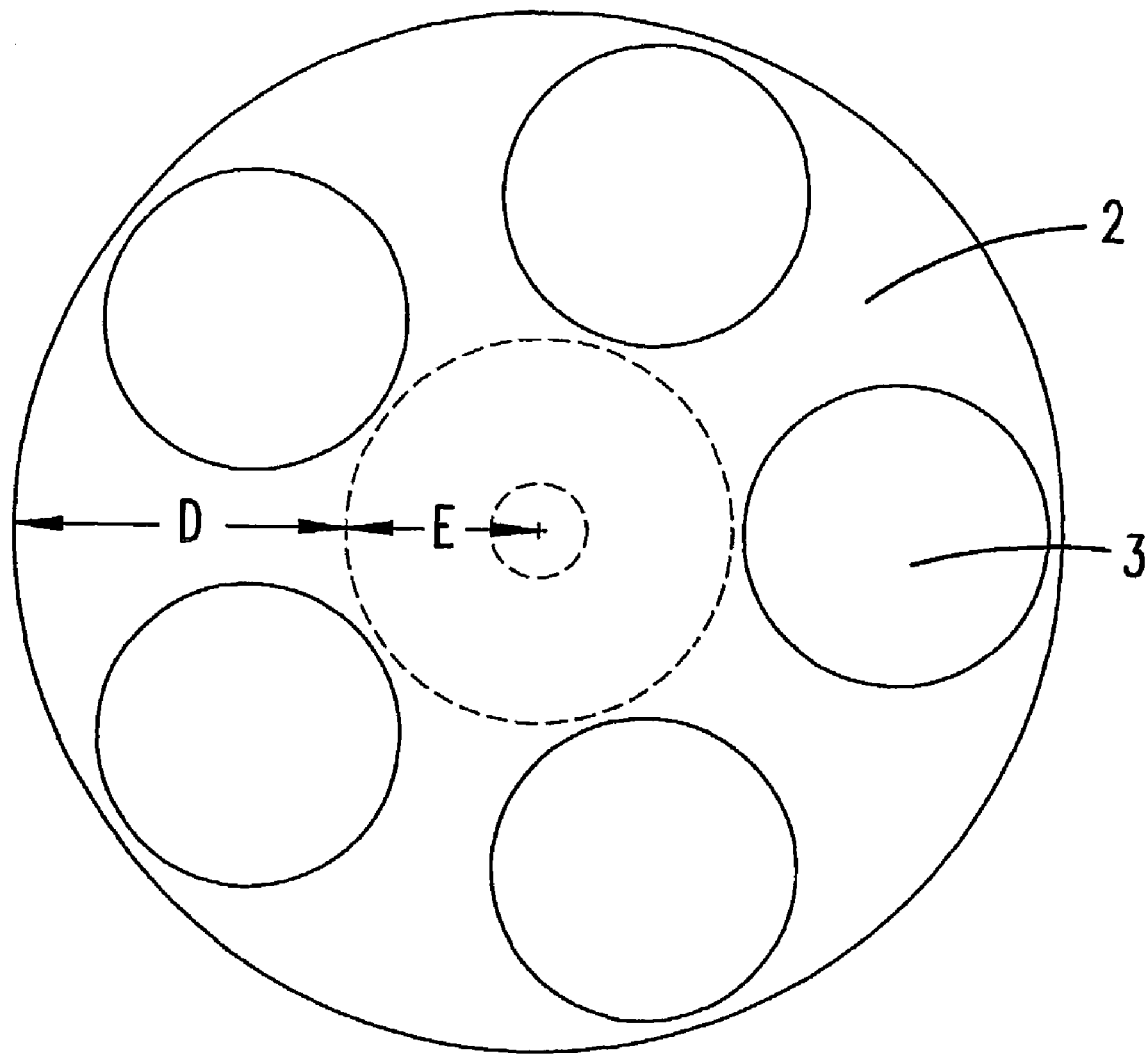
FIG. 3 shows in diagrammatic representation, a plan view of the process chamber base.

FIG. 2 diagrammatically depicts the partial pressure curves of metalorganic decomposition products as P1 and P2. The partial pressures P1 and P2 decrease linearly over the length of the deposition zone D, reaching a minimum, which corresponds to less than 10% of the maximum, at the end of the deposition zone. The method parameters are optimal if not only the partial pressure curve is linear but also the ratio of the maximums of the two partial pressures at the start of the deposition zone D is approximately equal to the ratio of the minimums of the two partial pressures at the end of the deposition zone.

Since the mixing ratio of the two carrier gas components T2' and T2" also has an influence on the diffusion capacity of the metalorganic decomposition products in the vapor phase, equalizing the two Reynolds numbers R1 and R2 also influences the transfer of the decomposition products from the vapor phase to the substrate 5, which is denoted by DIF in FIG. 2, in the direction which is transverse with respect to the flow transfer direction KONV.

Figure 4:
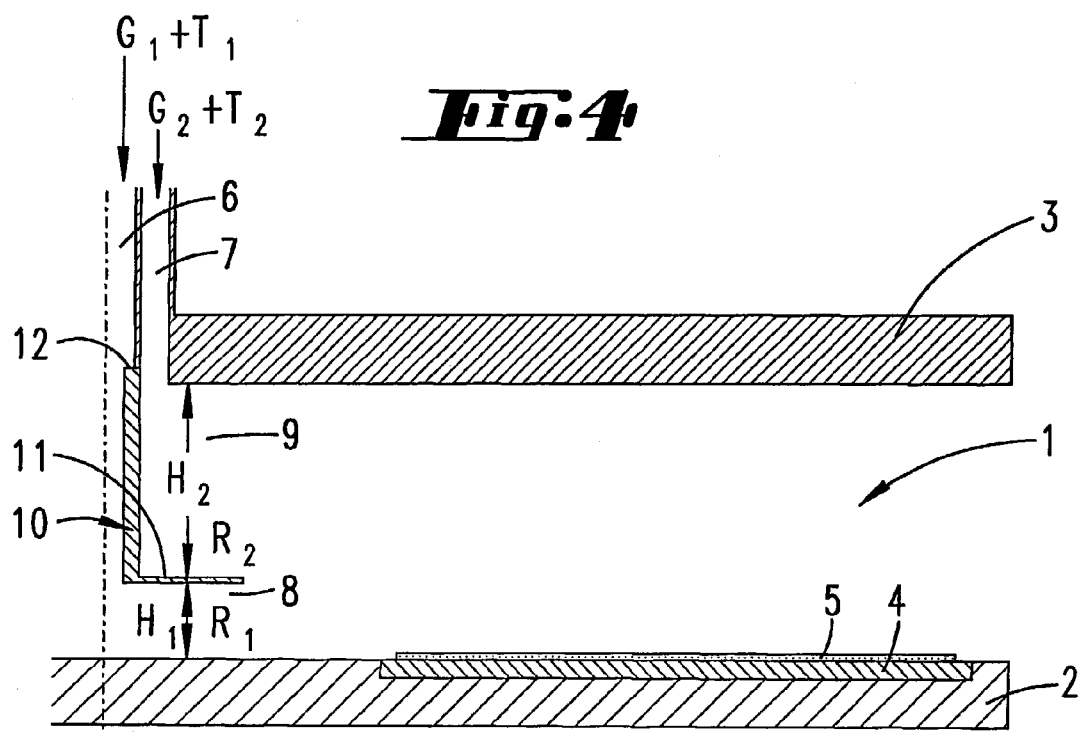
FIG. 4 shows a further exemplary embodiment of the invention, in which the heights of the gas outlet zones can be adjusted.
Figure 5:
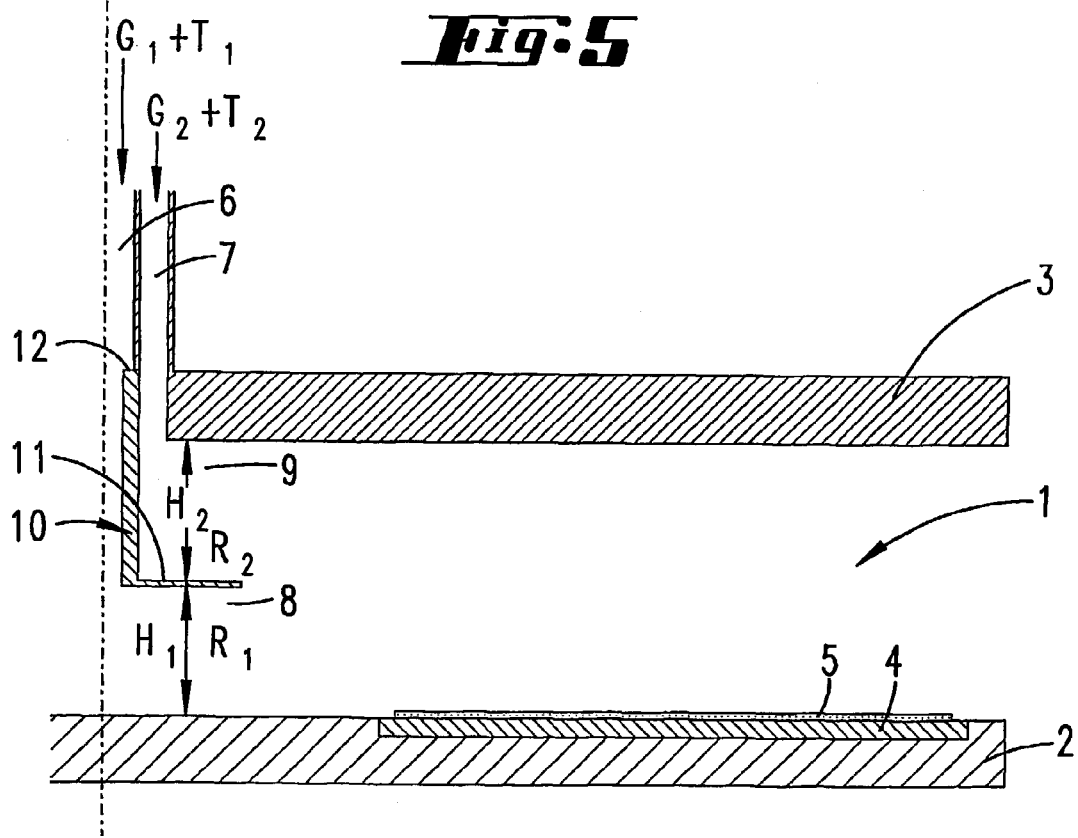
FIG. 5 shows the exemplary embodiment according to FIG. 4 with changed heights.

In variants of the invention, which are illustrated in FIGS. 4 to 6, the Reynolds number in the two gas outlet zones 8, 9 is varied by varying the geometric conditions. This is achieved by adjusting the heights H1 and H2. In the exemplary embodiment illustrated in FIGS. 4 and 5, the gas outlet flange 5, can be adjusted in the height direction. This causes the height position of the horizontal flange collar 11 of the gas outlet flange 10 to change. The two gas outlet zones 8, 9 are separated from one another by this flange collar 11, which is in the form of an annular disc. The gas outlet flange 10 may also comprise an exchangeable quartz part which is connected to a feedline tube at a connection location 12.

In the exemplary embodiment illustrated in FIG. 6, the height H2 of the gas outlet zone 9 which is remote from the process chamber base 2 is varied while the gas outlet flange 10 is held in a fixed position. In this exemplary embodiment, the upper boundary of the gas outlet zone 9 is formed by a thick-walled tube 13 which can be displaced in the direction of the double arrow in order in this way to influence the height dimension H2.

All features disclosed are (inherently) pertinent to the invention. The disclosure content of the associated/appended priority documents (copy of the prior application) is hereby incorporated in its entirety in the disclosure of the application, partly for the purpose of incorporating features of these documents in claims of the present application.

What is claimed is:

1. Method for depositing in particular crystalline layers on in particular crystalline substrates in a process chamber of a CVD reactor, in which at least a first reaction gas and a second reaction gas are passed through separate feedlines into in each case a gas outlet zone in an entry zone of the process chamber, in which method the gas outlet zones lie one above the other between the process chamber base and the process chamber cover and have different heights, in which method the first reaction gas, if appropriate together with a carrier gas, flows out of the gas outlet zone adjacent to the process chamber base, and in which method a carrier gas is ad-mixed at least with the second reaction gas which flows out of the gas outlet zone which is remote from the process chamber base and the flow parameters are selected in such a way that the second reaction gas decomposes pyrolytically substantially only in the entry zone, and the decomposition products diffuse, in a deposition zone disposed downstream of the entry zone, transversely with respect to the direction of flow of the gases, to a substrate disposed on the process chamber base where, together with decomposition products of the first reaction gas, they condense to form a layer, characterized in that the kinematic viscosity of the carrier gas which is admixed with the second reaction gas is set, in particular by mixing two gases of very different kinematic viscosity, in such a manner that the quotient of the Reynolds numbers in the two gas outlet zones, given substantially approximately equal mean gas velocities, is approximately one.

2. Method according to claim 1, or in particular according thereto, characterized in that the carrier gases and used are hydrogen and/or nitrogen.

3. Method according to claim 1 or in particular according thereto, characterized in that the first reaction gas is a metal hydride, for example phosphine and/or arsine.

4. Method according to claim 1 or in particular according thereto, characterized in that the second reaction gas is a metalorganic compound, for example trimethylgallium and/or trimethylindium.

5. Device for carrying out a method according claim 1, having a process chamber into which at least a first reaction gas and a second reaction gas, together with a carrier gas, are passed through separate feed lines into in each case a gas outlet zone in an entry zone of the process chamber, the gas outlet zones lying one above the other between the process chamber base and the process chamber cover and having different heights, the gas outlet zones which lie one above the other being adjoined in the downstream direction by an entry zone for pyrolytic decomposition of the reaction gas which flows out of the gas outlet zone which is remote from the process chamber base, and a deposition zone, which is disposed downstream of the entry zone and in which there are one or more substrate holders, the sum of the lengths of the entry zone and deposition zone being at least 35 cm, the sum of the heights and of the two gas outlet zones being at least 4 cm, the length of the deposition zone being at least 20 cm, and the ratio of the heights of the gas outlet zone which is remote from the process chamber base and of the gas outlet zone which is adjacent to the process chamber base being greater than four, and at least two carrier gas feed lines for different carrier gases, each having a gas flow controller, opening out into the feed line for the second reaction gas.

6. Device according to claim 5 or in particular according thereto, characterized in that the height of the second gas outlet zone associated with the second reaction gas is at least twice as great, in particular at least four times as great, preferably five times as great, as the height of the first gas outlet zone associated with the first reaction gas.

7. Device according to claim 5 or in particular according thereto, characterized in that the process chamber is in the shape of a cylinder with a gas feedline located in the center and a heated process chamber base on which there are disposed substrate holders which are driven in rotation in the manner of satellites.

8. Method for depositing in particular crystalline layers on in particular crystalline substrates in a process chamber of a CVD reactor, in which method at least a first reaction gas and a second reaction gas are passed through separate feedlines into in each case a gas outlet zone in an entry zone of the process chamber, in which method the gas outlet zones, which are separated from one another by means of a gas outlet flange, are located one above the other between the process chamber base and the process chamber cover, in which method the first reaction gas, if appropriate with a carrier gas, flows out of the gas outlet zone adjacent to the process chamber base, and in which method a carrier gas is admixed at least with the second reaction gas, which flows out of the gas outlet zone which is remote from the process chamber base and the flow parameters are selected in such a way that the second re-action gas decomposes pyrolytically substantially only in the entry zone, and the decomposition products diffuse, in a deposition zone disposed downstream of the entry zone, transversely with respect to the direction of flow of the gases, to a substrate disposed on the process chamber base where, together with decomposition products of the first reaction gas, they condense to form a layer, characterized in that the heights of the gas outlet zones, in particular through the selection of a suitable gas outlet flange, are set in such a manner that the quotient of the Reynolds numbers in the two gas out-let zones, given substantially equal mean gas velocities, is approximately one.

9. Device for carrying out a method according to claim 8, having a process chamber into which at least a first reaction gas and a second reaction gas, together with a carrier gas, are passed through separate feedlines into in each case a gas outlet zone in an entry zone of the process chamber, the gas outlet zones, which are separated from one another by means of a gas outlet flange, being located one above the other between the process chamber base and the process chamber cover, the gas outlet zones which are located one above the other being adjoined in the downstream direction by an entry zone for pyrolytic decomposition of the reaction gas flowing out of the gas outlet zone which is remote from the process chamber base, and a deposition zone, which is disposed downstream of the entry zone and in which there are one or more substrate holders, characterized in that the heights of the gas outlet zones can be set in particular by selection of a suitable gas discharge flange.

10. Device according to claim 8 or in particular according thereto, characterized in that the spacing between a flange collar, which is in the form of an annular disc, of the gas outlet flange and the upper boundary of the gas outlet zone which is remote from the process chamber base can be adjusted by axial displacement of a thick-walled tube.

11. The device according to claim 9 wherein the discharge flange is adjustable in height.

\* \* \* \* \*

UNITED STATES PATENT AND TRADEMARK OFFICE
CERTIFICATE OF CORRECTION

PATENT NO. : 6,972,050 B2
DATED : December 6, 2005
INVENTOR(S) : Michael Bremser et al.

It is certified that error appears in the above-identified patent and that said Letters Patent is hereby corrected as shown below:

<u>Title page,</u>
Item [75], replace with:
-- [75] Inventors: Michael Bremser, Seal Beach, CA (US)
                       Martin Dauelsberg, Aachen (DE)
                       Gerhard Karl Strauch, Aachen (DE) --.

Signed and Sealed this

Twenty-first Day of March, 2006

JON W. DUDAS
*Director of the United States Patent and Trademark Office*